United States Patent
Gwo et al.

(10) Patent No.: US 7,803,261 B2
(45) Date of Patent: Sep. 28, 2010

(54) METHOD TO DEPOSIT PARTICLES ON CHARGE STORAGE APPARATUS WITH CHARGE PATTERNS AND FORMING METHOD FOR CHARGE PATTERNS

(75) Inventors: Shangjr Gwo, HsinChu (TW); Hsien-Te Tseng, Toucheng Town (TW)

(73) Assignee: National Tsing Hua University, Hsinchu (TW)

( * ) Notice: Subject to any disclaimer, the term of this patent is extended or adjusted under 35 U.S.C. 154(b) by 399 days.

(21) Appl. No.: 12/000,944

(22) Filed: Dec. 19, 2007

(65) Prior Publication Data
US 2009/0159995 A1 Jun. 25, 2009

(51) Int. Cl.
*B01J 8/00* (2006.01)

(52) U.S. Cl. ..................................... 204/450

(58) Field of Classification Search ............... 204/450
See application file for complete search history.

(56) References Cited

U.S. PATENT DOCUMENTS

| | | | | |
|---|---|---|---|---|
| 3,472,676 A | * | 10/1969 | Cassiers et al. | 430/118.3 |
| 3,920,992 A | * | 11/1975 | Van den Bogaert et al. | 378/28 |
| 3,932,751 A | * | 1/1976 | Verhille | 378/28 |
| 3,935,455 A | * | 1/1976 | Van den Bogaert | 378/28 |
| 4,701,387 A | * | 10/1987 | Alexandrovich et al. | 430/45.2 |

* cited by examiner

*Primary Examiner*—Evan Pert
(74) *Attorney, Agent, or Firm*—Rosenberg, Klein & Lee

(57) ABSTRACT

The present invention discloses a method to deposit particles on a charge storage apparatus with charge patterns and a forming method for charge patterns. The forming method for charge patterns includes providing the charge storage apparatus having an electrically conducting substrate and a charge storage media layer. The charge storage apparatus is disposed in a vacuum or an anhydrous environment. An electrode and the electrically conducting substrate are utilized to conduct a first voltage and a second voltage respectively to form an electric field. Charges are then stored into the charge storage media layer of the charge storage apparatus through the electric field and the charge patterns are then formed. Accordingly, particles are deposited on the charge pattern-defined areas.

8 Claims, 7 Drawing Sheets

METHOD TO DEPOSIT PARTICLES ON CHARGE STORAGE APPARATUS WITH CHARGE PATTERNS AND FORMING METHOD FOR CHARGE PATTERNS

FIELD OF THE INVENTION

The present invention is related to a method to deposit particles on charge storage apparatus with charge patterns and a forming method for charge patterns and, more particularly, to the formation of charge patterns and the formation of particle structures with a single particle layer.

BACKGROUND OF THE INVENTION

Recently, as micro-electro-mechanical systems (MEMS) are developed gradually, many bulky components can be shrunk. In various MEMS fields, the aspects which can be applied to biomedical detection are particularly emphasized. Chips produced by the MEMS fabrication process not only has higher detection efficiency, low sample consumption, low energy consumption, smaller volume and lower production costs, but also allow one to manufacture the disposable chips with low cost and reduced cross contamination. Therefore, the development potential and application value are immense. The MEMS systems not only provide functionalities of environmental detection, food detection and various chemical analyses, but also can perform physiology analyses by using the chips with portable detection devices. Moreover, the device only needs a small amount of samples to achieve fast recognition which is time-saving and good for environmental concerns.

To meet the use requirement of collecting samples, the attractive characteristic is then developed to selectively adsorb specific samples. For instance, patterns are preformed by diversity of materials and then are imposed on the chips to adsorb particles with complementary characteristics.

However, the existing methods require much MEMS and chemical/biological processes to accomplish, and have a worse efficiency on selectively absorbing targeted materials. These consequences may influence the manufacturing costs and limit the usage.

To overcome the foregoing shortcomings of the prior arts, the present invention, which is based on years of experience on related research and development, invents a method to deposit particles on a charge storage apparatus with charge patterns and a forming method for charge patterns to overcome the foregoing problems.

SUMMARY OF THE INVENTION

Briefly, an object of the present invention is to provide a method to deposit particles on a charge storage apparatus with charge patterns and a forming method for charge patterns, and more particularly to the formation of charge patterns and the formation of particle structures with a single particle layer.

To achieve the foregoing object, the charge storage apparatus with charge patterns comprises an electrically conducting substrate and a charge storage media layer. The charge storage media layer is formed on the electrically conducting substrate, and has charge patterns therein.

Moreover, the forming method for charge patterns provides a charge storage apparatus with an electrically conducting substrate that is disposed in a vacuum or an anhydrous environment. An electrode and the electrically conducting substrate are utilized to conduct a first voltage and a second voltage respectively to form an electric field. Charges are then stored in the charge storage apparatus through the electric field and the charge patterns are then formed. Meanwhile, oxidation generated by the electric field is prevented when the charge pattern apparatus is in the vacuum or the anhydrous environment.

Furthermore, in accordance with the method for depositing particles, a charge storage apparatus with charge patterns is provided, and is immersed in a solution with a plurality of colloidal particles. The colloidal particles then are deposited on the charge patterns by using Coulomb force or electrophoresis phenomenon. Colloidal particles of the single particle layer then are formed on the charge patterns through rinsing by a forming solution. Moreover, a depositing structure with multiple types of particles can be formed by rewriting the charge patterns and repeatedly depositing the colloidal particles.

The formation of the charge patterns and the formation of the single particle layer can be accomplished by using the method to deposit particles on charge storage apparatus with charge patterns and the forming method for charge patterns, thereby further forming the depositing structure with multiple particles.

Other features and advantages of the present invention and variations thereof will become apparent from the following description, drawings, and claims.

DETAILED DESCRIPTION OF THE PREFERRED EMBODIMENTS

Figure 1:
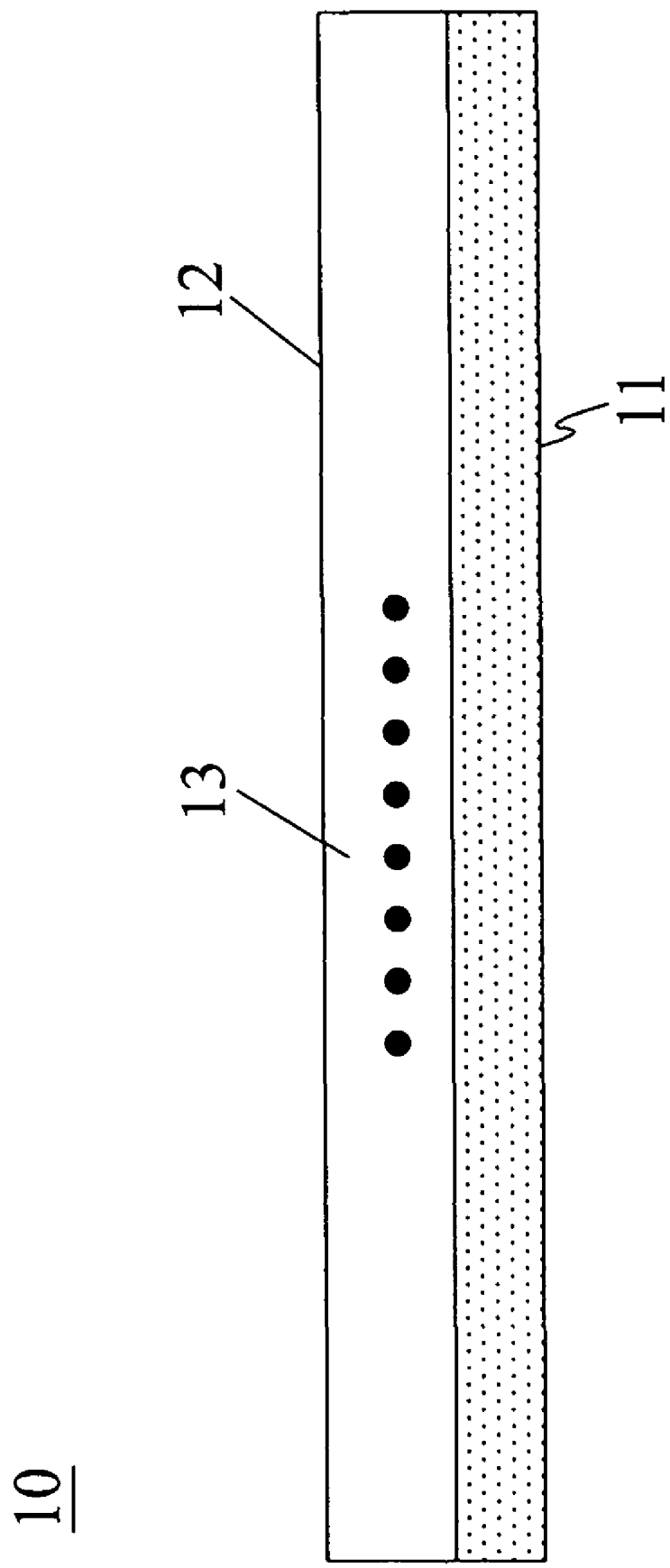
FIG. 1 shows a charge storage apparatus with charge patterns of the invention.

Referring to the related figures for the method to deposit particles on charge storage apparatus with charge patterns and a forming method for charge patterns according to a preferred embodiment of the present invention, wherein the same elements are described by the same reference numerals.

Referring to FIG. 1, a schematic diagram illustrates a charge storage apparatus with charge patterns of the invention. The charge storage apparatus 10 provides an electrically conducting substrate 11 that has a charge storage media layer 12, and a charge pattern 13 is stored in the charge storage media layer 12.

The electrically conducting layer 11 is preferably a silicon substrate, and the charge storage media layer 12 is preferably a multilayered structure composed of a silicon nitride layer. The charge patterns 13 are usually composed of electrons or holes, or both electrons and holes.

Figure 2:
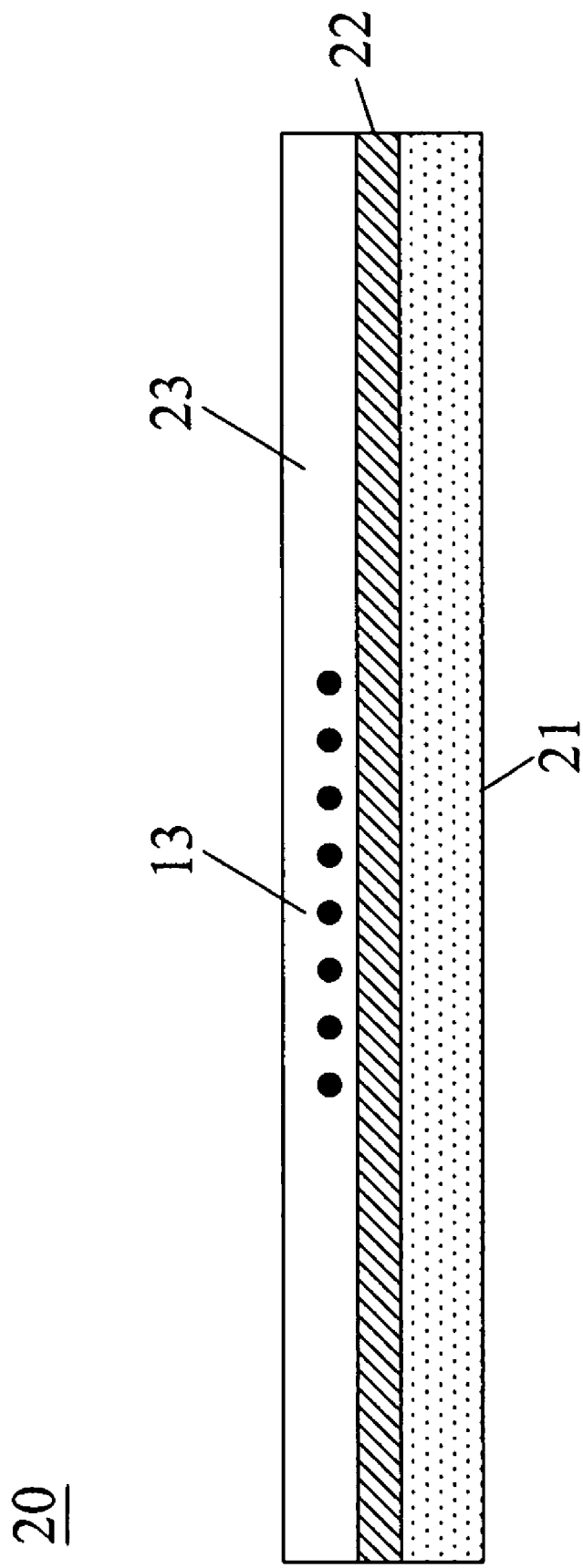
FIG. 2 shows another charge storage apparatus with charge patterns of the invention.

Referring to FIG. 2, a schematic diagram illustrates another charge storage apparatus with charge patterns of the invention. The charge storage apparatus 20 provides an electrically conducting substrate 21 that has a silicon oxide layer 22, and a silicon nitride layer 23 then is formed on the silicon oxide layer 22 so as to form a silicon nitride/silicon oxide/silicon multilayered structure. Moreover, the charge patterns 13 are stored in the silicon nitride layer 23 or between the silicon nitride layer 23 and the silicon oxide layer 22.

The electrically conducting substrate 21 is preferably a silicon substrate and the charge patterns 13 are usually composed of electrons or holes, or both electrons and holes.

Figure 3:
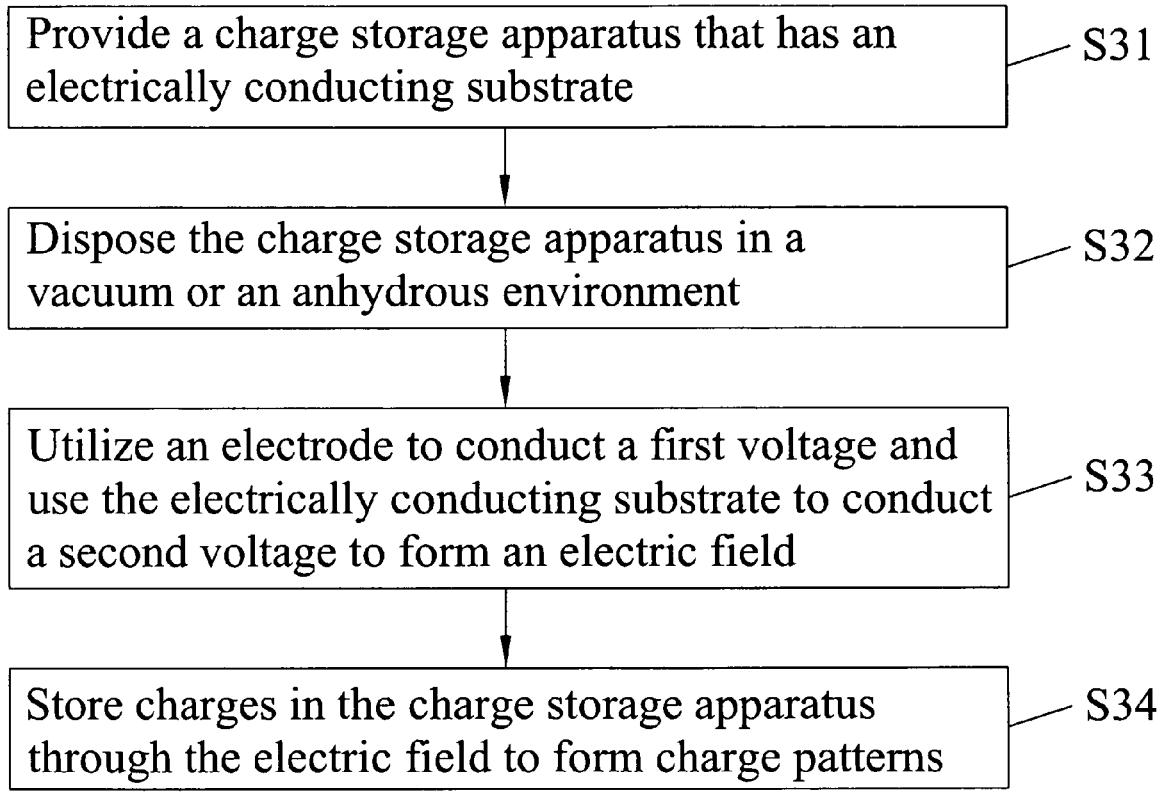
FIG. 3 shows a flowchart of a forming method for charge patterns of the invention.

Referring to FIG. 3, a flowchart illustrates a forming method for charge patterns of the invention. The method comprises the following steps:

Step S31: Provide a charge storage apparatus that has an electrically conducting substrate;

Step S32: Dispose the charge storage apparatus in a vacuum or an anhydrous environment;

Step S33: Utilize an electrode to conduct a first voltage and use the electrically conducting substrate to conduct a second voltage to form an electric field; and Step S34: Store charges in the charge storage apparatus through the electric field to form charge patterns.

The oxidation generated by the electric field is prevented when the charge storage apparatus is in the vacuum or the anhydrous environment, and the electrode can be a probe or a stamp with patterns. Moreover, charges are rewritable to form the required charge patterns for applications.

Figure 4:
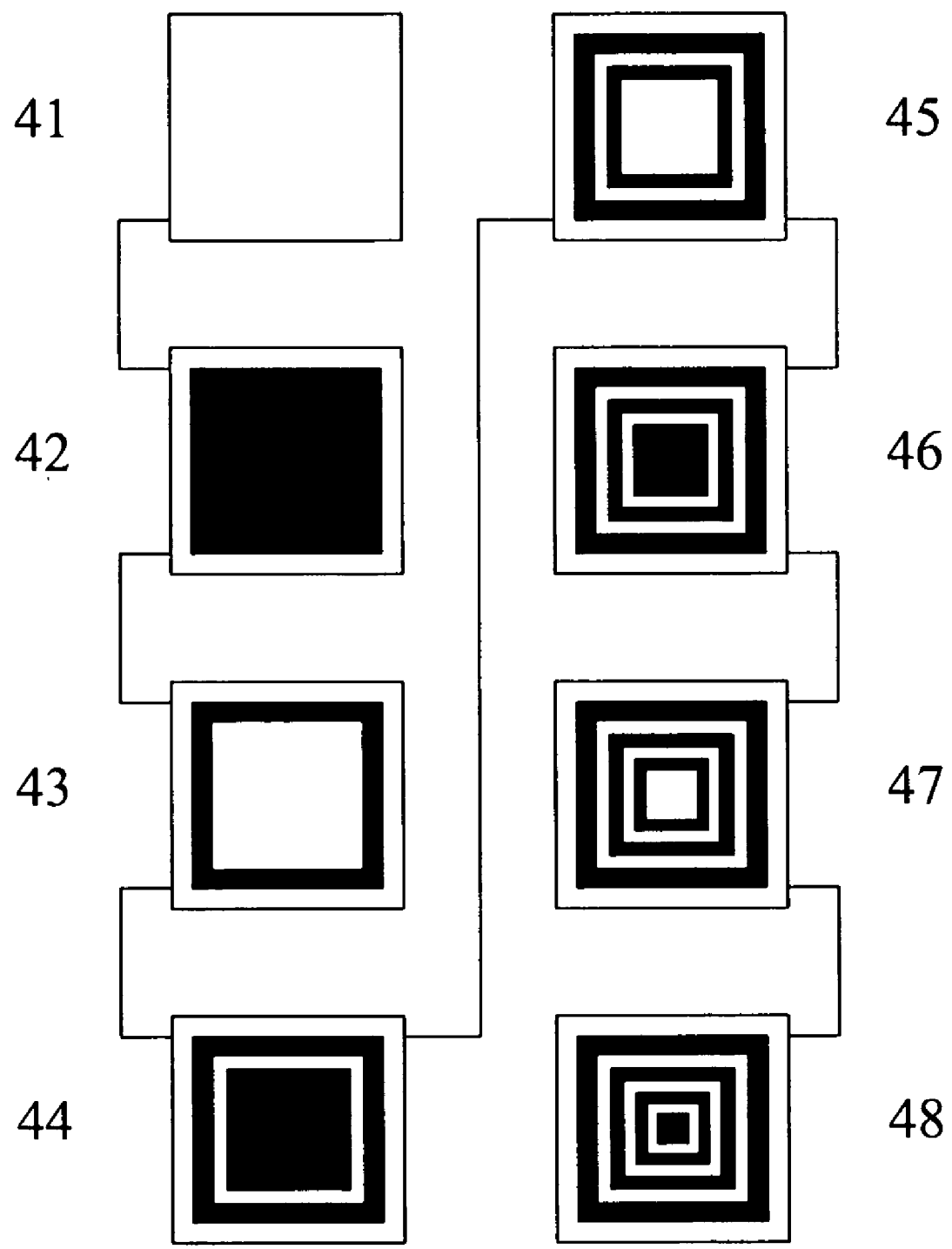
FIG. 4 shows a schematic diagram of charges of the invention.

Referring to FIG. 4 for the schematic diagram of charges of the invention is illustrated. A charge pattern 41 of the charge storage apparatus is in the status without writing charges. Electrons then are written to form a charge pattern 42 of a first square. A portion of electrons on the charge pattern 42 of the first square is erased to enable the electrons to form a charge pattern 43 of a first frame. Electrons then are written to the charge pattern 43 of the first frame by using a predetermined range to form a charge pattern 44 of a second square. A portion of the electrons on the charge pattern 44 of the second square is erased to enable the electrons to from a charge pattern 45 of a second frame. In the next step, electrons are written to the charge pattern 45 of the second frame by using a predetermined range to form a charge pattern 46 of a third square. A portion of the electrons on the charge pattern 45 of the third square is erased to enable the electrons to form a charge pattern 47 of the third frame. Lastly, electrons are written to the charge pattern 47 of the third frame by using a predetermined range to form a charge pattern 48 of the fourth square. The charge pattern required for applications is therefore formed by repeatedly writing charges.

Figure 5:
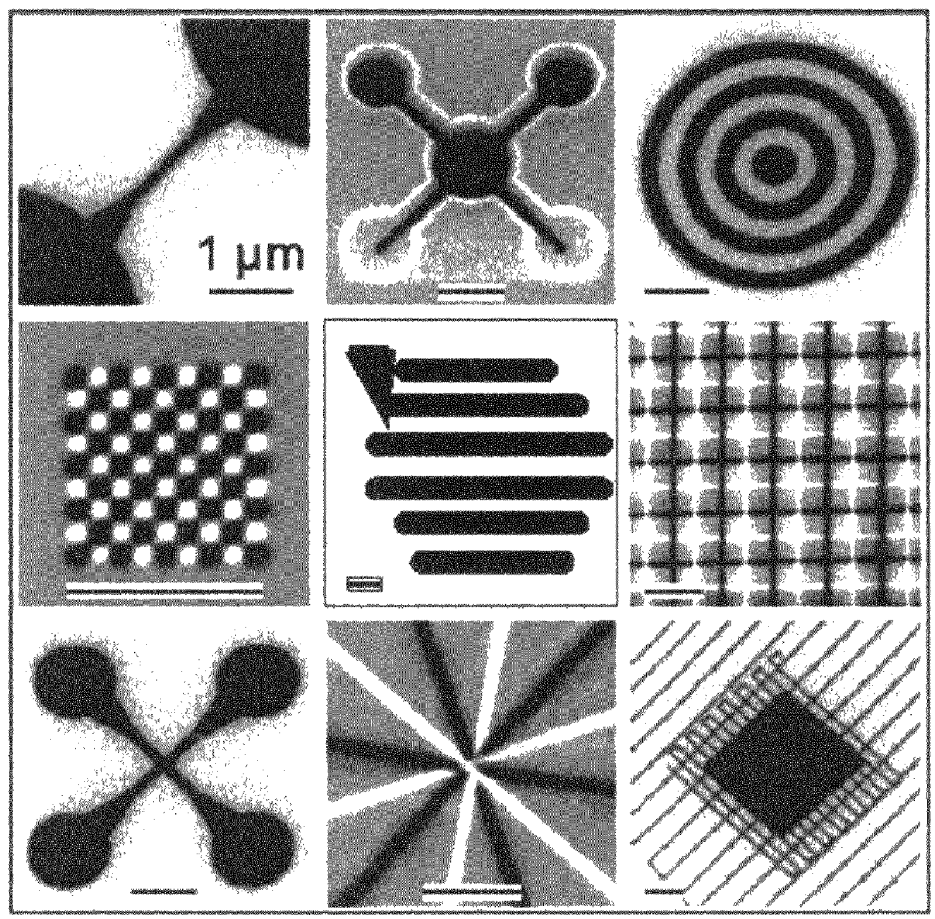
FIG. 5 shows the images of charge patterns displayed by an electric force microscope (EFM) of the invention.

Referring to FIG. 5 for the images of the charge patterns shown by an electric force microscope (EFM) of the invention is illustrated. Various charge patterns are shown in the EFM image, wherein the dark areas are charge patterns of stored holes, and the light areas are charge patterns of stored electrons. Accordingly, the forming method for charge patterns of the invention has high flexibility and applicability.

Figure 6:
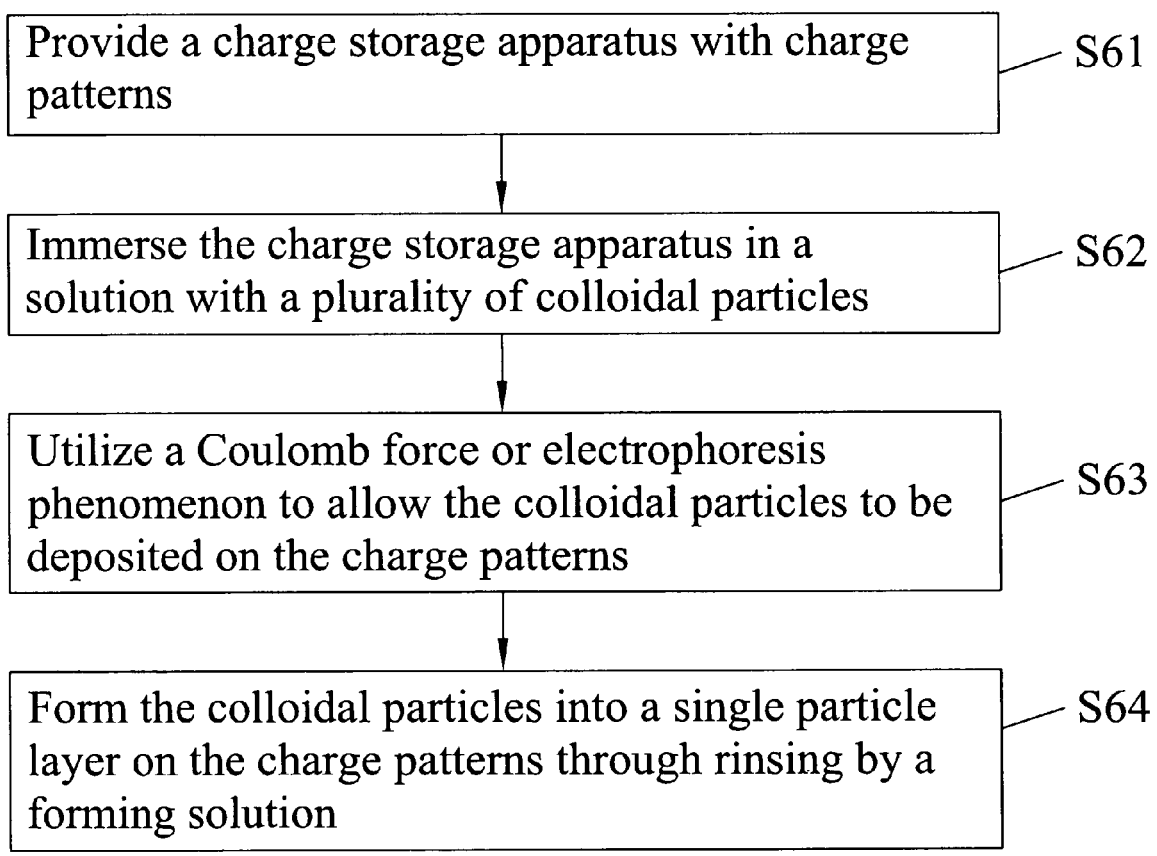
FIG. 6 shows a flowchart of a method to deposit particles of the invention.

Referring to FIG. 6 for the flowchart of a method to deposit particles of the invention, the method comprises the following steps:

Step S61: Provide a charge storage apparatus with charge patterns;

Step S62: Immerse the charge storage apparatus in a solution with a plurality of colloidal particles;

Step S63: Utilize a Coulomb force or electrophoresis phenomenon to allow the colloidal particles to be deposited on the charge patterns; and Step S64: Form the colloidal particles into a single particle layer on the charge patterns through rinsing by a forming solution.

The colloidal particles are usually particles through chemical modification, and the colloidal particles can be metals, semiconductors, insulating materials, organic molecules, chemical particles, bacteria, viruses, cells, protein molecules, drug molecules, deoxyribonucleic acid (DNA) molecules or ribonucleic acid (RNA) molecules. A stack structure with multiple particles is further formed by rewriting charge patterns and repeatedly depositing colloidal particles.

Figure 7:
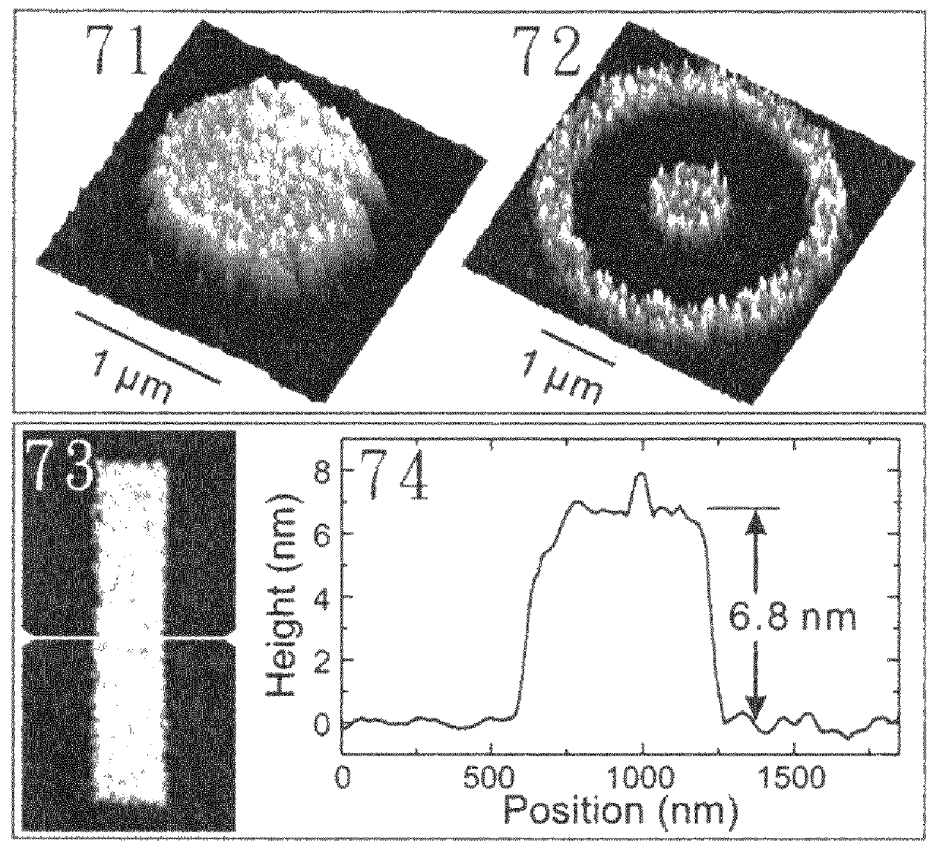
FIG. 7 shows the images observed by an atomic force microscope (AFM) after depositing particles.

FIG. 7 shows the images observed by an atomic force microscope (AFM) after depositing particles. In the AFM images 71, 72 and 73, when the cross section of the AFM image 73 is displayed to a picture 74, the particle deposition layer with uniform thickness on the charge patterns is observed through the method for depositing particles. Accordingly, the method can be taken as the foundation for the stack structure with multiple types of particles.

Although the features and advantages of the embodiments according to the preferred invention are disclosed, it is not limited to the embodiments described above, but encompasses any and all modifications and changes within the spirit and scope of the following claims.

What is claimed is:

1. A forming method for charge patterns, comprising:
providing a charge storage apparatus having an electrically conducting substrate;
disposing the charge storage apparatus in a vacuum environment or an anhydrous environment;
employing an electrode to conduct a first voltage and utilizing the electrically conducting substrate to conduct a second voltage so as to form an electric field; and
enabling charges to be stored in the charge storage apparatus through the electric field, thereby forming charge patterns;
wherein oxidation generated by the electric field is prevented when the charge storage apparatus is in the vacuum environment or the anhydrous environment.

2. The forming method for charge patterns of claim 1, further comprising the step of providing a probe as the electrode.

3. The forming method for charge patterns of claim 1, further comprising the step of providing a stamp with a pattern as the electrode.

4. The forming method for charge patterns of claim 1, further comprising the step of rewriting the charges to form the charge patterns.

5. A method for depositing particles, comprising:
providing a charge storage apparatus having charge patterns;
immersing the charge storage apparatus in a solution having a plurality of colloidal particles;
utilizing Coulomb force or electrophoresis phenomenon to enable the colloidal particles to be deposited on the charge patterns; and
forming the colloidal particles into a single particle layer on the charge patterns through rinsing by a forming solution.

6. The method for depositing particles of claim 5, further comprising the step of providing colloidal particles through chemical modification of the colloidal particles.

7. The method for depositing particles of claim 5, further comprising the step of providing metals, semiconductors, insulating materials, organic molecules, chemical particles, bacteria, viruses, cells, protein molecules, drug molecules, deoxyribonucleic acid molecules or ribonucleic acid molecules as the colloidal particles.

8. The method for depositing particles of claim 5, further comprising the step of repeating the method for depositing particles, wherein a multiparticle structure is formed by writing different charge patterns and repeatedly depositing the colloidal particles.

* * * * *